(12) United States Patent
Takenaka et al.

(10) Patent No.: US 8,386,973 B2
(45) Date of Patent: Feb. 26, 2013

(54) BEHAVIORAL SYNTHESIS APPARATUS, METHOD, AND PROGRAM HAVING TEST BENCH GENERATION FUNCTION

(75) Inventors: Takashi Takenaka, Tokyo (JP); Akira Mukaiyama, Tokyo (JP); Kazutoshi Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/336,328

(22) Filed: Dec. 23, 2011

(65) Prior Publication Data

US 2012/0096418 A1    Apr. 19, 2012

Related U.S. Application Data

(62) Division of application No. 12/022,573, filed on Jan. 30, 2008, now Pat. No. 8,091,051.

(30) Foreign Application Priority Data

Jan. 30, 2007   (JP) .................................. 2007-019451

(51) Int. Cl.
*G06F 17/50*   (2006.01)
(52) U.S. Cl. ........ 716/104; 716/108; 716/113; 716/136; 703/16
(58) Field of Classification Search .................. 716/104, 716/108, 113, 136; 703/16
See application file for complete search history.

(56) References Cited

U.S. PATENT DOCUMENTS

| | | | |
|---|---|---|---|
| 5,177,440 A * | 1/1993 | Walker et al. .................. | 714/736 |
| 5,710,711 A * | 1/1998 | Cheng et al. .................. | 714/726 |
| 5,920,490 A | 7/1999 | Peters | |
| 6,212,489 B1 * | 4/2001 | Klein et al. ...................... | 703/13 |
| 6,216,252 B1 | 4/2001 | Dangelo et al. | |
| 6,810,373 B1 * | 10/2004 | Harmon et al. .................. | 703/14 |
| 6,845,341 B2 | 1/2005 | Beverly et al. | |
| 6,985,840 B1 | 1/2006 | Hsu et al. | |
| 7,137,087 B1 | 11/2006 | Mohanty et al. | |
| 7,444,277 B2 | 10/2008 | Rich et al. | |
| 7,653,849 B1 * | 1/2010 | Tabatabaei .................... | 714/726 |
| 7,904,857 B2 | 3/2011 | Wang et al. | |
| 2006/0015313 A1 | 1/2006 | Wang et al. | |
| 2007/0106488 A1 | 5/2007 | Chang et al. | |
| 2007/0156378 A1 | 7/2007 | McNamara | |
| 2007/0250799 A1 | 10/2007 | Bunin et al. | |

(Continued)

FOREIGN PATENT DOCUMENTS

| | | | |
|---|---|---|---|
| JP | 2000-242684 A | | 9/2000 |
| JP | 2000310667 A | * | 11/2000 |

(Continued)

OTHER PUBLICATIONS

NN8912354, "Design for Input and Output Verification", IBM Technical Disclosure Bulletin, Dec. 1989, vol. 32, No. 7, pp. 354-357 (5 pages).*

(Continued)

*Primary Examiner* — Phallaka Kik
(74) *Attorney, Agent, or Firm* — Scully, Scott, Murphy & Presser, P.C.

(57) ABSTRACT

Disclosed is a behavioral synthesis apparatus for generating a test bench where the same test vector can be used in both the behavioral simulation and the RTL simulation. The apparatus includes input application/output signal observation timing signal generation means that generates an input application timing signal, an output observation timing signal, and logic circuits for the input application timing signal and the output observation timing signal; and test bench generation means that generates a test bench that observes the signals, applies inputs, and observes outputs.

5 Claims, 24 Drawing Sheets

U.S. PATENT DOCUMENTS

| | | | |
|---|---|---|---|
| 2007/0277130 A1* | 11/2007 | Lavelle | 716/4 |
| 2007/0294651 A1 | 12/2007 | Tsai et al. | |
| 2008/0077379 A1 | 3/2008 | Baumgartner et al. | |
| 2008/0092092 A1 | 4/2008 | Dalton et al. | |
| 2011/0197171 A1 | 8/2011 | Wang et al. | |

FOREIGN PATENT DOCUMENTS

| | | |
|---|---|---|
| JP | P2001-060210 A | 3/2001 |
| JP | 2004-145712 | 5/2004 |
| JP | P2004-145670 A | 5/2004 |
| JP | 2005-78402 | 3/2005 |
| JP | 2007-019451 | 7/2011 |

OTHER PUBLICATIONS

Andrews et al., "RIBASTEM: A Method for Testing VHDL Behavioral Models", Eighth IEEE International Symposium on High Assurance Systems Engineering, Mar. 25-26, 2004, pp. 187-196.*

Riazati et al., "Improved Assertion Lifetime via Assertion-Based Testing Methodology", 2006 International Conference on Microelectronics, Dec. 16-19, 2006, pp. 48-51.*

Lee et al., "Behavioral Synthesis for Easy Testability in Data Path Allocation", IEEE 1992 International Conference on Computer Design: VLSI in Computers and Processors, Oct. 11-14, 1992, pp. 29-32.

Japanese Official Action dated Jul. 5, 2011 in connection with corresponding Japanese Application No. JP 2007-019451.

U.S. Office Action dated Nov. 9, 2010 from U.S. Appl. No. 12/022,573.

U.S. Office Action dated May 11, 2011 from U.S. Appl. No. 12/022,573.

Japanese Official Action dated Jan. 8, 2013 from related application JP 2011-192362 together with a partial English language abstract.

* cited by examiner

FIG.4

```
1:input int a,b,c,d ;
2:output int o;
3:void func(){
4:    int v0, v1 ;
5:    v0 = a + b;
6:    if ( c == 0 ) {
7:        v1 = c + d ;
8:    }
9:    o = v0 + v1 ;
10:}
```

FIG.5

```
1: input int a,b,c,d ;
2: output int o;
3: void fnc() {
4:    int v0, v1 ;
5:    v0 = (a) (+) (b);        ⎫ STATE1
6:    if ( (c) (==) 0 ) {      ⎫
7:       v1 = (c) (+) (d) ;    ⎬ STATE2
8:    }                        ⎭
9:    (o) = v0 (+) v1 ;        ⎫ STATE3
10: }
```

```
 1: int func(int a,b,c,d)
 2: {
 3:   int v0, v1;
 4:   int o;
 5:   v0 = a + b;
 6:   if ( c == 0 ) {
 7:     v1 = c + d;
 8:   }
 9:   o = v0 + v1;
10:   return o;
11: }
```

FIG.7A

FIG.7B iport1

FIG.7C iport2

FIG.7F oport1

FIG.8A

```
module main (
    clk, rst, iport1, iport2,oport1);
input clk;
input rst;
input [0:31]iport1 ;
input [0:31]iport2;
output [0:31] oport1 ;
reg   [0:31] o_t ;
reg   [0:31] v0;
reg   [0:31] v1 ;
reg   [0:2] state ;

parameter    T_STATE1 = 2'b01 ;
parameter    T_STATE2 = 2'b10 ;
parameter    T_STATE3 = 2'b11 ;

assign oport1 = o_t ;
```

FIG.8B

```
always @ ( posedge clk )
    if ( rst ) begin
        state <= T_STATE1;
        v0   <= 0 ;
        v1   <= 0 ;
        o_t  <= 0 ;
    end else begin
        case(state)
            T_STATE1: begin
                v0   <= iport1 + iport2;
                state <= T_STATE2;
            end
            T_STATE2: begin
                if ( iport1 == 0 ) v1 <= iport1 + iport2;
                state <= T_STATE3;
            end
            T_STATE3: begin
                o_t = v0 + v1 ;
                state <= T_STATE1;
            end
        endcase
    end
endmodule
```

FIG.9A

```
module main (clk, rst,
             iport1, iport2, oport1,
             a_e, b_e, c_e, d_e, o_e);
input clk;
input rst;
input [0:31] iport1 ;
input [0:31] iport2;
output [0:31] oport1 ;
output a_e;
output b_e;
output c_e;
output d_e;
output o_e;
reg    [0:31] o_t ;
reg    [0:31] v0 ;
reg    [0:31] v1 ;
reg    [0:2] state ;
parameter    T_STATE1 = 2'b01 ;
parameter    T_STATE2 = 2'b10;
parameter    T_STATE3 = 2'b11;

assign a_e = ( state == T_STATE1) ? 1'b1 : 1'b0 ;
assign b_e = ( state == T_STATE1) ? 1'b1 : 1'b0 ;
assign c_e = ( state == T_STATE2) ? 1'b1 : 1'b0 ;
assign d_e = ( ( state == T_STATE2 )
             && ( iport1 == 0 )) ? 1'b1 : 1'b0 ;
assign o_e = ( state == T_STATE3) ? 1'b1 : 1'b0 ;
assign oport1 = o_t ;
```

FIG.9B

```
always @ ( posedge clk )
  if ( rst ) begin
    state <= T_STATE1;
    v0   <= 0 ;
    v1   <= 0 ;
    o_t  <= 0 ;
  end else begin
    case(state)
      T_STATE1: begin
        v0   <= iport1 + iport2;
        stat <= T_STATE2;
      end
      T_STATE2: begin
        if ( iport1 == 0 ) v1 <= iport1 + iport2;
        state <= T_STATE3;
      end
      T_STATE3: begin
        o_t = v0 + v1 ;
        state <= T_STATE1;
      end
    endcase
  end
endmodule
```

FIG.10

```
module tb()
begin
reg clk;
reg rst;
reg [0:31] iport1, iport2;
wire [0:31] oport1;
wire a_e, b_e, c_e, d_e, o_e;

if ( a_e == 1 ){
    Apply value of input signal a to iport1
}
if ( b_e == 1 ){
    Apply value of input signal b to iport1
}
if ( c_e == 1 ){
    Apply value of input signal c to iport2
}
if ( d_e == 1 ){
    Apply value of input signal d to iport2
}
if ( o_e == 1 ){
    Observe oport1 and compare value with expected value of output signal o
} main dut(.clk(clk), .rst(rst), .iport1(iport1), .iport2(iport2),
        .oport1(oport1),
        .a_e(a_e), .b_e(b_e), .c_e(c_e), .d_e(d_e), .o_e(o_e));

end
```

FIG.13

```
1:input int a ;
2:input int b ;//pragma enable_signal_is b_e
3:input int c ;
4:input int d ;
5:output int a_e;
6:output int b_e;
7:output int c_e;//pragma enable_signal_for c
8:output int d_e;
9:output int o;
10:output int o_e;
11:void func()
12:{
13:    int v0, v1 ;
14:
15:    v0 = a + b;
16:    a_e = 1; b_e = 1 ;
17:    c_e = 1;
18:    if ( c == 0 ) {
19:        v1 = c + d ;
20:        d_e = 1;
21:    }
22:    o = v0 + v1 ;
23:    o_e = 1 ;
24: }
```

FIG.15

```
1: input int a ;
2: input int b ;
3: input int c ;
4: input int d ;
5: output int o1;
6: output int o2;
7: void func()
8: {
9:    int v0, v1 ;
10:
11:   v0 = a + b;
12:   v1 = b + c;
13:   o1 = v0;
14:   v2 = v0 + v1;
15:   o2 = v2;
16: }
```

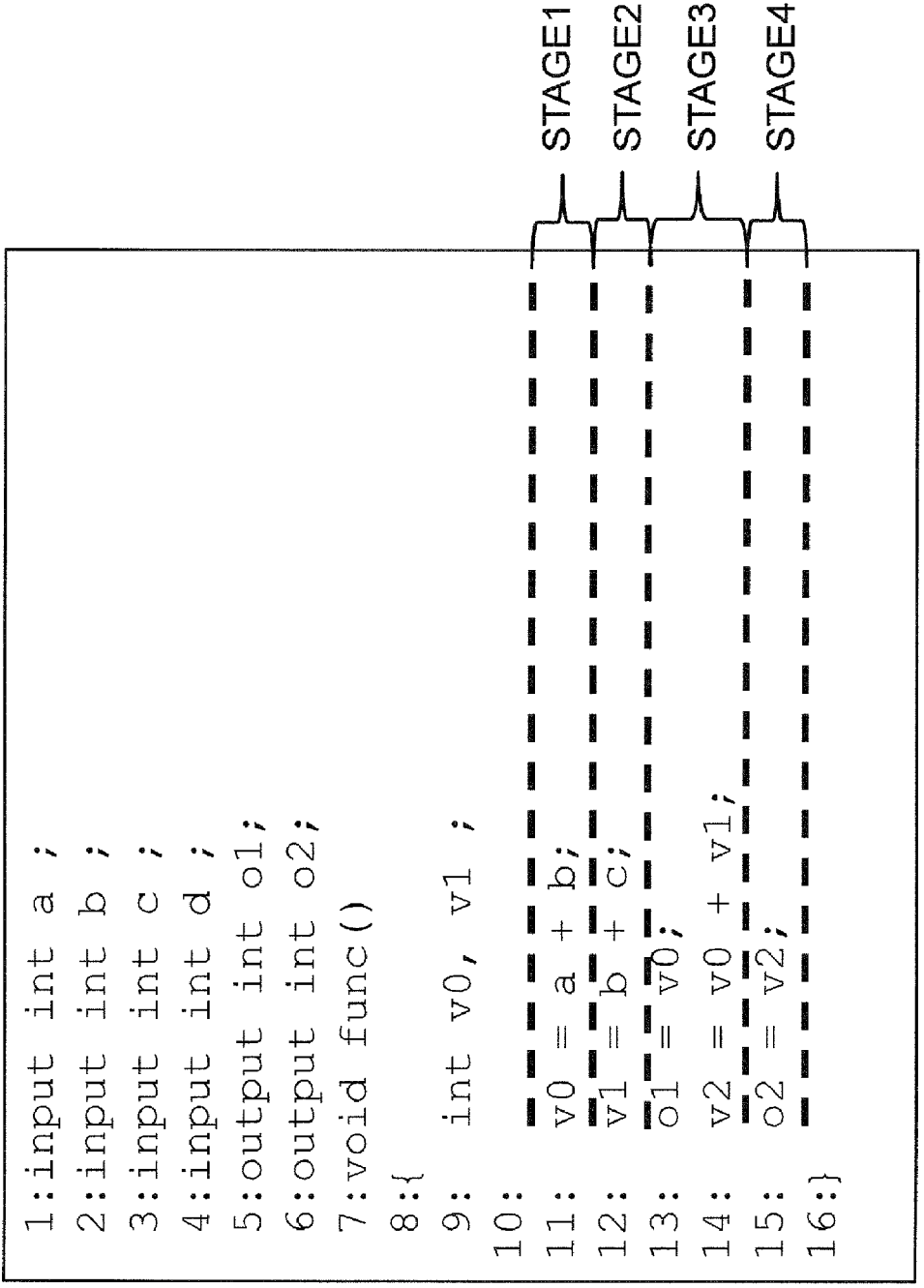

FIG.17A

```
module main (
    clk, rst, a,b,c,d,o1,o2);
input clk;
input rst;
input [0:31]  a;
input [0:31]  b;
input [0:31]  c;
input [0:31]  d;
output [0:31] o1 ;
output [0:31] o2 ;
reg    [0:31] v0 ;
reg    [0:31] v1 ;
reg    [0:31] v2 ;
assign o1 = v0;
assign o2 = v2;
```

FIG.17B

```
always @ ( posedge clk )
    if ( rst ) begin
        v0 <= 0 ;
        v1 <= 0 ;
        v2 <= 0 ;
    end else begin
        v0 <= a + b ;
        v1 <= b + c ;
        v2 <= v0 + v1 ;
    end
endmodule
```

FIG.18A

```
module main (
    clk, rst, a,b,c,d,o1,o2);
input clk;
input rst;                    // SIGNAL EFFECTIVE, PERIOD
input [0:31] a;  // 1,1
input [0:31] b;  // 1,1
input [0:31] c;  // 2,1
input [0:31] d;  // 2,1
output [0:31] o1 ;  // 3,1
output [0:31] o2 ;  // 4,1
reg [0:31] v0 ;
reg [0:31] v1 ;
reg [0:31] v2 ;

assign o1 = v0;
assign o2 = v2;
```

FIG.18B

```
always @ ( posedge clk )
    if ( rst ) begin
        v0 <= 0 ;
        v1 <= 0 ;
        v2 <= 0 ;
    end else begin
        v0 <= a + b ;
        v1 <= b + c ;
        v2 <= v0 + v1 ;
    end
endmodule
```

FIG.19

```
module tb()
begin
reg clk;
reg rst;
reg [0:31] a,b,c,d;
wire [0:31] o1,o2;
    if (First and subsequent cycle after reset is released and in each clock period) {
        Apply value of input signal a to a
    }
    if (First and subsequent cycle after reset is released and in each clock period) {
        Apply value of input signal b to b
    }
    if (Second and subsequent cycle after reset is released and in each clock period) {
        Apply value of input signal c to c
    }
    if (Second and subsequent cycle after reset is released and in each clock period) {
        Apply value of input signal d to d
    }
    if (Third and subsequent cycle after reset is released and in each clock period) {
        Observe o1 and compare it with expected value of output signal o1
    }
    if (Fourth and subsequent cycle after reset is released and in each clock period) {
        Observe o2 and compare it with expected value of output signal o2
    }
main dut(.clk(clk), .rst(rst), .a(a), .b(b), .c(c), .d(d),
         .o1(o1), .o2(o2));
end
```

FIG.20

```
module tb()
begin
reg clk;
reg rst;
reg [0:31] iport1, iport2;
wire [0:31] oport1;
wire a_e, b_e, c_e, d_e, o_e;

if (a_e== 1 and reset is not effective) {
        Apply value of input signal a to iport1
    }
    if (b_e== 1 and reset is not effective) {
        Apply value of input signal b to iport1
    }
    if (c_e== 1 and reset is not effective) {
        Apply value of input signal c to iport2
    }
    if (d_e== 1 and reset is not effective) {
        Apply value of input signal d to iport2
    }
    if (o_e== 1 and reset is not effective) {
        Observe oport1 and compare it with expected value of output signal o
    } main dut(.clk(clk), .rst(rst), .iport1(iport1), .iport2(iport2),
.oport1(oport1),
.a_e(a_e), .b_e(b_e), .c_e(c_e), .d_e(d_e), .o_e(o_e));

end
```

FIG.21

```
module tb()
begin
reg clk;
reg rst;
reg [0:31] a,b,c,d;
wire [0:31] o1,o2;
    if (First and subsequent cycle after reset is released, in each clock period, and stall signal is not effective) {
        Apply value of input signal a to a
    }
    if (First and subsequent cycle after reset is released, in each clock period, and stall signal is not effective) {
        Apply value of input signal b to b
    }
    if (Second and subsequent cycle after reset is released, in each clock period, and stall signal is not effective) {
        Apply value of input signal c to c
    }
    if (Second and subsequent cycle after reset is released, in each clock period, and stall signal is not effective) {
        Apply value of input signal d to d
    }
    if (Third and subsequent cycle after reset is released, in each clock period, and stall signal is not effective) {
        Observe o1 and compare it with expected value of output signal o1
    }
    if (Fourth and subsequent cycle after reset is released, in each clock period, and stall signal is not effective) {
        Observe o2 and compare it with expected value of output signal o2
    }
main dut(.clk(clk), .rst(rst), .a(a), .b(b), .c(c), .d(d),
        .o1(o1), .o2(o2));
end
```

FIG.22

```
1:input int a ;
2:input int b ;
3:input int c ;
4:output int o1 ;
5:int ary[256];
6:void func()
7:{
8:    int v0;
9:    int o ;
10:    ary[a] = b ;
11:    o1 = ary[c] ;
12:}
```

FIG.23A

```
module main (
  clk, rst, a, b, c, o1,
  ad, rd, wd, we);
input clk;
input rst;
input  [0:31] a ;
input  [0:31] b ;
input  [0:31] c;
output [0:31] o1 ;
output [0:7]  ad;
input  [0:31] rd;
output [0:31] wd;
output we;
reg [0:31] o_t ;
reg [0:7]  ad_t;
reg [0:31] wd_t;
reg [0:0]  we_t;
reg [0:31] v0 ;
reg [0:2]  state ;

parameter  T_STATE1 = 2'b00 ;
parameter  T_STATE2 = 2'b01 ;
parameter  T_STATE3 = 2'b11 ;
parameter  T_STATE4 = 2'b01 ;

assign o1 = o_t ;
assign ad = ad_t ;
assign wd = wd_t ;
assign we = we_t ;
```

FIG.23B

```
always @ ( posedge clk )
  if ( rst ) begin
    state <= T_STATE1;
    v0  <= 0 ;
    v1  <= 0 ;
    o_t <= 0 ;
  end else begin
    case(state)
      T_STATE1: begin
        ad_t = a;
        wd_t = b;
        we_t = 1;
        state <= T_STATE2;
      end
      T_STATE2: begin
        ad_t = c;
        we_t = 0;
        state <= T_STATE3;
      end
      T_STATE3: begin
        o_t = rd ;
        state <= T_STATE4;
      end
      T_STATE4: begin
        state <= T_STATE1;
      end
    endcase
  end
endmodule
```

FIG.24

```
module tb()
begin
reg clk;
reg rst;
reg [0:31]   a, b, c;
wire [0:31]  ol;
wire [0:7]   ad ;
wire [0:31]  rd, wd ;
wire         we // Input application, output observation
(omitted)

// Module instantiation
main dut(.clk(clk),  .rst(rst),  .a(a),  .b(b),  .c(c),  .ol(ol)
         .ad(ad),    .rd(rd),    .wd(wd),  .we(we));

memory m1(.ad(ad),  .rd(rd),  .wd(wd),  .we(we),  .clk(clk),  .rst(rst));

end
```

BEHAVIORAL SYNTHESIS APPARATUS, METHOD, AND PROGRAM HAVING TEST BENCH GENERATION FUNCTION

REFERENCE TO RELATED APPLICATION

This application is based upon and claims the benefit of the priority of Japanese patent application No. 2007-019451, filed on Jan. 30, 2007, and is a divisional of U.S. Ser. No. 12/022,573 filed Jan. 30, 2008, the disclosure of which is incorporated herein in its entirety by reference thereto.

FIELD OF THE INVENTION

The present invention relates to a behavioral synthesis apparatus, a behavioral synthesis method, and a behavioral synthesis program that generate an RTL (Register Transfer Level) circuit description, which describes specific functions (circuits), from a behavior level circuit description that describes the behavior of a semiconductor integrated circuit, and more particularly to a behavioral synthesis apparatus, a behavioral synthesis method, and a behavioral synthesis program that can output a test bench for verifying the generated RTL circuit.

BACKGROUND OF THE INVENTION

The recent trend in designing a system LSI is that a system LSI is designed first at a high abstraction level and then an RTL description is generated through behavioral synthesis.

In this design method, the behavioral description, which implements the desired behavior of a system LSI, is designed first.

Next, the behavior simulation is performed to confirm if the designed behavioral description achieves the desired circuit behavior, that is, if the design is correct.

If the design is correct, the behavior description is transformed into an RTL description through behavioral synthesis.

When an LSI is designed using the design method described above, there is a requirement that the test vector used in the behavioral simulation is used also in the RTL simulation after the behavioral synthesis. For example, this requirement has first and second purposes described below.

The first purpose is to confirm if the behavioral description before behavioral synthesis and the RTL description after behavioral synthesis implement the same function.

If the behavioral description and the RTL description do not implement the same function, the behavioral simulation, if performed to confirm that the behavioral description achieves the desired behavior of the circuit, is meaningless. This is because the designed circuit does not eventually implement the desired behavior.

Conventionally, whether or not the behavioral description and the RTL description implement the same function is confirmed by using the same test vector for the behavioral simulation and the RTL simulation and comparing the results of both simulations.

The second purpose is to confirm the performance of the circuit after the behavioral synthesis.

Because time information is not usually included in the behavioral description, the circuit performance, for example, how much time is required to achieve a function, cannot be confirmed.

In contrast, the RTL simulation reveals how much time is required to achieve a function, that is, the RTL simulation shows the circuit performance.

Therefore, the related art technique checks whether or not the designed behavioral description achieves the desired performance by using the same test vector in both the behavioral simulation and the RTL simulation and evaluating the circuit performance measured in the RTL simulation.

The problem here is that the test vector used in the behavioral simulation cannot be used directly in the RTL simulation.

The reason is that the input application timing and the output observation timing differ between the behavioral simulation and the RTL simulation.

In general, there is no concept of timing (clock) in the behavioral description. Even if there is the concept of timing, the granularity of timing in the behavioral description is different from that of the RTL description. Therefore, the sequence of data that is used as the test vector in the behavioral simulation, if applied at each clock cycle during the RTL simulation, does not produce the same result as that produced by the behavioral simulation. Similarly, the output of the RTL simulation, if observed at each clock cycle, is not the same as that produced by the behavioral simulation.

Patent Document 1 (Japanese Patent Kokai Publication No. JP-P2005-78402A) discloses a behavioral synthesis system that solves the problems described above. The behavioral synthesis system described in Patent Document 1 is proposed primarily to solve the first problem described above (the sequence of data that is used as the test vector in the behavioral simulation, if applied at each clock cycle during the RTL simulation, does not produce the same result as that produced by the behavioral simulation). This conventional behavioral synthesis system assumes that the file read function, which reads the sequence of input from a file, and the file write function, which writes the sequence of output to a file, are described in the behavioral description. The file read function and the file write function are generically called a file function. This conventional behavioral synthesis system comprises syntax analysis means, control data flow graph construction means, scheduling/binding means, test bench generation means, and RTL generation means. The behavioral synthesis system having this configuration operates as follows.

That is, the syntax analysis means and the control data flow graph construction means leave the file functions, which are included in the behavioral description, undeleted.

Resource binding and scheduling are performed to create an RTL description based on the constructed control data flow graph.

The file input for a file function is represented in the created RTL description using the select signal of the multiplexer for input data. The file output condition is represented using the select signal of the multiplexer for output data.

However, the behavioral synthesis system described in Patent Document 1, which operates on the premise that the file functions are used in the behavioral description, is applicable only to a behavioral description satisfying this premise.

An example of the equivalence verification method is disclosed in Patent Document 2 (Japanese Patent Kokai Publication No. JP-P2004-145712A). The equivalence verification method disclosed in Patent Document 2 is proposed primarily to solve the first problem described above. This equivalence verification method finds a comparison time based on the number of delay cycles from the time the input signal is determined to the time the output signal is determined in the RTL simulation result and compares the value of the output signal of the RTL simulation result with the value of the output signal of the behavioral simulation at the comparison time. The problem with this method is that the kind of circuit to which this method is can be applied is limited.

This is because no consideration is made in this method for a circuit whose input value application time differs according to the input signal.

In addition, no consideration is made in this method for a case in which the comparison time cannot be determined based on "the number of delay cycles", for example, when the number of delay cycles depend on the input data.

Patent Document 3 (U.S. Pat. No. 6,845,341 B2) discloses a performance analysis system. The general operation of this performance analysis system is as follows. That is, a test bench for executing the behavioral simulation and the RTL simulation at the same time is created. A module for absorbing the difference in the input time and the output time of the behavioral simulation and the RTL simulation is inserted between the behavioral description and the test bench and between the RTL description and the test bench. In this configuration, the behavioral simulation and the RTL simulation receive the same test vector and the number of clocks required for the RTL description to execute simulation is measured to evaluate the performance.

[Patent Document 1]
Japanese Patent Kokai Publication No. JP-P2005-78402A
[Patent Document 2]
Japanese Patent Kokai Publication No. JP-P2004-145712A
[Patent Document 3]
U.S. Pat. No. 6,845,341 B2 (FIG. 2)

The above mentioned patent documents are incorporated by reference. The analysis on the related arts given by the present invention will be described in the below.

In the related art system, there is a problem that the test vector used in the behavioral simulation cannot be used directly in the RTL simulation.

This is because of the input application timing and the output observation timing as described above. The above discussion shows that various propositions for solving this problem are not satisfactory.

Another reason for the above problem is the sharing of input terminals and output terminals. In general, there is not always a one-to-one correspondence between the input/output terminals of a behavioral description and the input/output terminals of an RTL description.

A still another reason for the above problem is a behavior that cannot be represented by a behavioral description. There are many behavioral descriptions where the input/output behavior during a reset is not specified. For example, when the C language is used for behavioral description, the behavior of the input/output during a reset is not specified (there is also behavioral description language, such as SystemC language, in which the input/output behavior during a reset is specified).

This means that the application of an input value, or the observation of an output value, if performed during the reset period at RTL simulation, does not give the same result as that produced by the behavioral simulation.

A still another reason for the above problem is an external model (shared memory model, memory model, operation unit model, etc.). In behavioral synthesis, an array in the behavioral description is implemented by a memory in the RTL description, and a variable in the behavioral description is implemented by a register outside the module in the RTL description.

When an operation in the behavioral description is implemented by an operation unit in the RTL description, the operation is sometimes output as a black box whose detailed internal logic is omitted.

This means that, to perform the RTL simulation, a memory simulation model, a register outside the module, and an operation unit simulation model that is output as a block box must be prepared.

Accordingly, it is an object of the present invention to provide a behavioral synthesis apparatus, a behavioral synthesis method, and a behavioral synthesis program that allow a test vector, which is used before the behavioral synthesis, to be used also for a circuit obtained after the behavioral synthesis.

According to a first aspect of the present invention, there is provided a system (apparatus) comprising: input application/output observation timing signal generation means that creates an input application timing signal and an output observation timing signal for each input and output of a circuit and creates respective logic circuits for the input application timing signal and the output observation timing signal; and test bench generation means that generates a test bench that applies an input to, and observes an output from, the circuit according to values of the input application timing signal and the output observation timing signal.

According to a second aspect of the present invention, there is provided a system (apparatus) comprising: test bench generation means that recognizes an input application timing signal and an output observation timing signal in a behavioral description of a circuit and generates a test bench that applies an input to, and observes an output from, the circuit according to values of the input application timing signal and the output observation timing signal.

According to a third aspect of the present invention, there is provided a system (apparatus) comprising: test bench generation means that generates a test bench that counts a number of clocks after a reset is released and, when the number of clocks matches a predetermined value, applies an input or observes an output.

According to a fourth aspect of the present invention, there is provided a system (apparatus) comprising: the test bench generation means that generates the test bench that does not apply an input or observe an output when a reset signal or a stall signal is effective.

According to a fourth aspect of the present invention, there is provided a system (apparatus) comprising: the test bench generation means that outputs the test bench that has a simulation model for a hardware resource that is output as a black box in an RTL (Register Transfer Level) description.

Also provided are the invention of methods and the invention of programs for the first to fifth aspects of systems (devices) described above.

The meritorious effects of the present invention are summarized as follows.

The present invention allows the same test vector to be used in a behavioral simulation and an RTL simulation. This is because, in the present invention, a test bench is output in such a way that a test vector used before behavioral synthesis can be used also in a circuit generated after behavioral synthesis.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a diagram showing an example of a behavioral description.

FIG. 5 is a diagram showing an example of the result of scheduling.

FIGS. 6A, 6B, 6C, 6D, 6E and 6F are diagrams showing an example of the result of binding.

FIGS. 7A, 7B, 7C, 7D, 7E and 7F are diagrams showing an example of the result of binding.

FIGS. 8A and 8B are diagrams showing an example of a description after FSM generation.

FIGS. 9A and 9B are diagrams showing an example of a description in which an input application timing signal, an output observation timing signal, and their logic circuits are created.

FIG. 10 is a diagram showing an example of a test bench.

FIG. 13 is a diagram showing an example of a behavioral description.

FIG. 15 is a diagram showing an example of a behavioral description used in an example.

FIG. 16 is a diagram showing an example of the result of scheduling.

FIGS. 17A and 17B are diagrams showing an example of a description after FSM generation.

FIGS. 18A and 18B are diagrams showing an example of a description in which the input application timing and the output observation timing are recorded.

FIG. 19 is a diagram showing an example of a test bench.

FIG. 20 is a diagram showing an example of a test bench.

FIG. 21 is a diagram showing an example of a test bench.

FIG. 22 is a diagram showing an example of a behavioral description.

FIGS. 23A and 23B are diagrams showing an example of an RTL description.

FIG. 24 is a diagram showing an example of a test bench.

PREFERRED MODES OF THE INVENTION

The present invention will be described more in detail with reference to the attached drawings.

First Example

Figure 1:
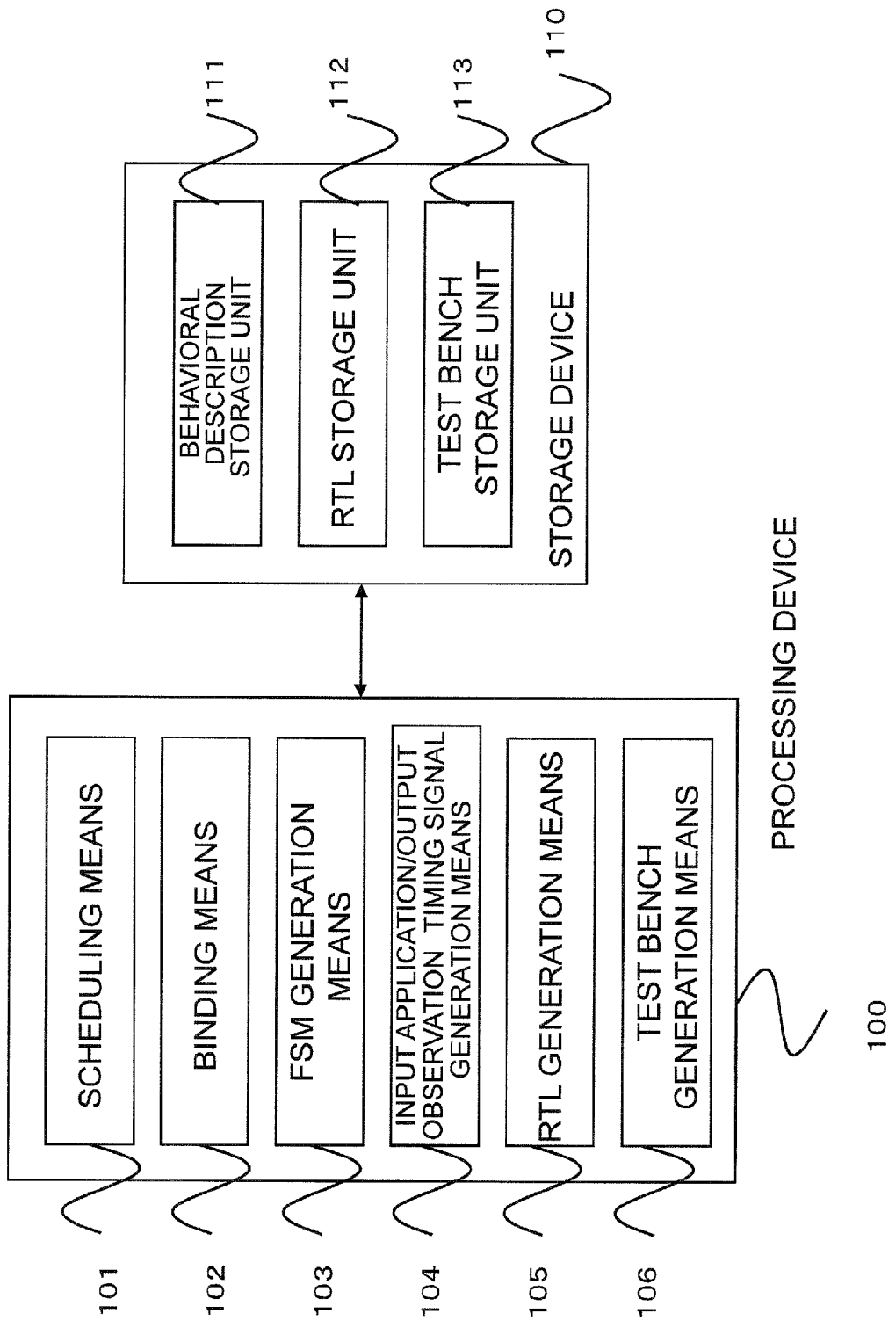
FIG. 1 is a block diagram showing the configuration of a first embodiment of the present invention.

Referring to FIG. 1, a behavioral synthesis system (apparatus) according to a first example of the present invention, comprises a computer (central processing device; processor; data processing device) 100 that operates under program control and data storage means (data storage device) 110.

The computer (central processing device; processor; data processing device) 100 comprises scheduling means 101, binding means 102, FSM (finite state machine) generation means 103, input application/output observation timing signal generation means 104, HDL (Hardware Description Language) generation means (RTL generation means) 105 for generating an HDL description such as an RTL (Register Transfer Level) description, and test bench generation means 106. The following describes the general operation of those means.

The scheduling means 101 assigns a behavioral description to an associated state. That is, the scheduling means 101 assigns arithmetic operation, conditional operation, read operation from an input terminal, write operation to an output terminal, an array read operation, and an array write operation, included in the behavioral description, respectively to states that will be executed.

The binding means 102 maps a behavioral description to hardware resources. That is, the binding means 102 maps:

an arithmetic/conditional operation in the behavioral description to an arithmetic/conditional operation unit, an input terminal in the behavioral description to an input terminal in the RTL description, an output terminal in the behavioral description to an output terminal in the RTL description, and an array in the behavioral description to a memory or a register file in the RTL description.

At this time, multiple input signals in the behavioral description are allowed to be mapped to one input signal in the RTL description and multiple output signals in the behavioral description are allowed to be mapped to one output signal in the RTL description. Similarly, multiple operations in the behavioral description are allowed to be mapped to one operation unit in the RTL description. Those are called "hardware resource sharing".

The finite state machine (FSM) generation means 103 creates a finite state machine (FSM) that controls state transitions and control logic circuits that control the hardware resources. The control logic circuits that control the hardware resources are logic circuits for controlling the hardware resources according to the assignment of the behavioral description to the states executed by the scheduling means 101 and the mapping of the behavioral description to the hardware resources executed by the binding means 102. That is, the control logic circuits include the following logic circuits: a logic circuit that makes an operation in the behavioral description executed with a mapped hardware resource in an assigned state; a logic circuit that makes a conditional operation executed with a mapped hardware source in an assigned state; a logic circuit that controls a read operation from an input terminal, a write operation to an output terminal, an array read operation, and an array write operation to be executed in an assigned state, with an mapped hardware resource, respectively.

The input application/output observation timing signal generation means 104 creates a new signal terminal corresponding to each of input terminals and output terminals. This signal is called an "input application/output observation timing signal".

In addition, the input application/output observation timing signal generation means 104 creates a logic circuit that outputs a predetermined value (called an "active value") to an input application/output observation timing signal only under the state and the condition in which a value is input from, or output to, the corresponding input signal/output signal.

The RTL generation means 105 converts the FSM and control logic circuits created by the finite state machine (FSM) generation means 103, the logic circuits created by the input application/output observation timing signal generation means 104, and the hardware resources into the HDL description and stores the converted description into the storage device 110.

The test bench generation means 106 creates a test bench. In the test bench, logic is created that observes the input application/output observation timing signal and, when an active value is output to this signal, applies an input or observes an output and compares the output value with an expected value. The test bench generation means 106 stores the created test bench in the storage device 110.

Figure 2:
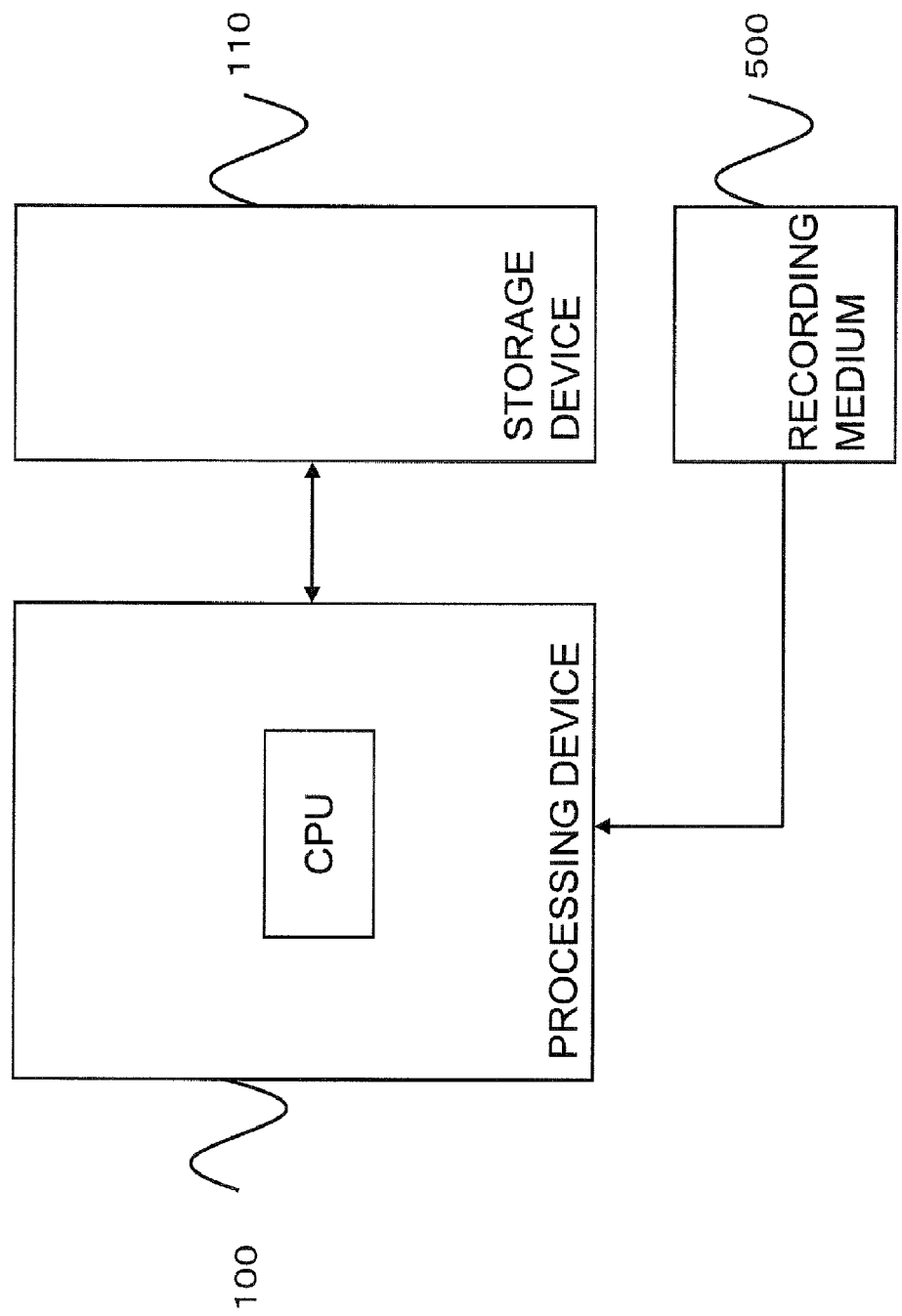
FIG. 2 is a block diagram showing an example of the configuration of the first embodiment of the present invention.

The behavioral synthesis apparatus in this example may be configured by an LSI or a logic circuit that implements the functions of the components shown in FIG. 1 or may be implemented by an information processing device (computer) such as the one shown in FIG. 2.

The information processing device shown in FIG. 2 comprises a processing device 100 including a CPU, a storage device 110, and a recording medium (also called a storage medium) 500. The processing device 100 reads a behavioral synthesis program from the recording medium 500 and, based on the behavioral synthesis program, causes the CPU to execute the processing of the scheduling means 101 and the binding (attendant information conversion) means 102 in this example which will be described below.

The storage device 110 has its area divided into a behavioral description storage unit 111, an RTL storage unit 112, and a test bench storage unit 113.

Figure 3:
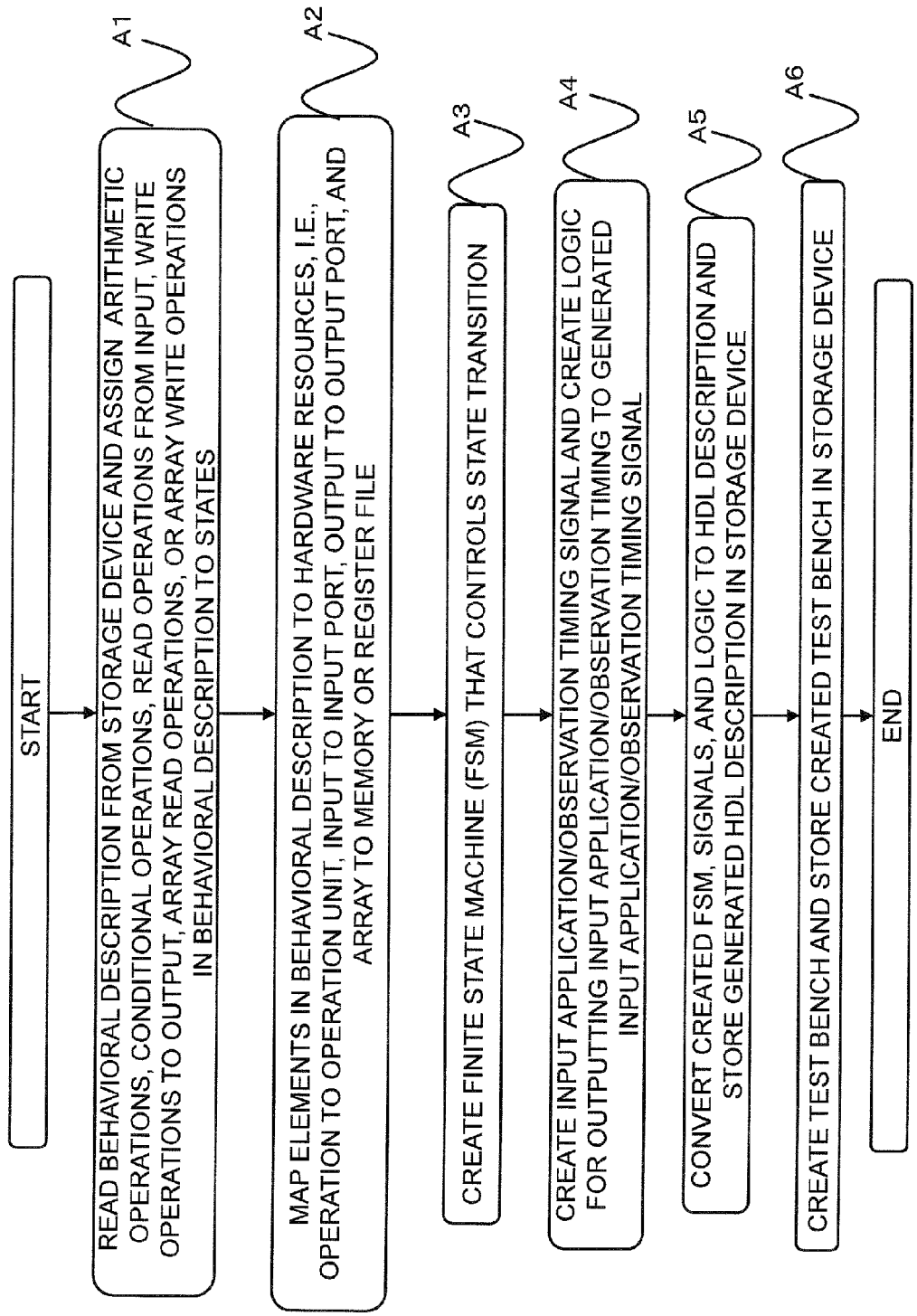
FIG. 3 is a flowchart showing the operation of the first embodiment of the present invention.

Next, the following describes the general operation of this example in detail with reference to FIG. 1 and the flowcharts in FIG. 3.

A behavioral description is included in the behavioral description storage unit 111 in advance. The behavioral description is coded in hardware description language (HDL) such as Verilog-HDL, VHDL, and SystemVerilog or in programming language such as the C language, C++ language, C# language, SystemC, SpecC, Java (registered trademark), Pert, Scheme, and Lisp. The behavioral description is sometimes coded in language created by extending the C language, C++ language, or Java (registered trademark) for coding circuits. The behavioral description is prepared, for example, by a designer.

First, the computer 100 reads a behavioral description from the behavioral description storage unit 111 in the storage device 110 and assigns the behavioral description to states with the use of scheduling means 101 included in the computer 100. That is, the computer 100 assigns arithmetic operations, conditional operations, read operations from inputs, write operations to outputs, array read operations, and array write operations, included in the behavioral description, to the states (step A1 in FIG. 3).

Next, the binding means 102 maps the behavioral description to the hardware resources. That is, the binding means 102 maps the following elements in the behavioral description to the respective hardware resources:

an arithmetic/conditional operation to an arithmetic/conditional operation unit, an input terminal in the behavioral level to an input terminal in the RTL, an output terminal in the behavioral level to an output terminal in the RTL, and an array to a memory or a register file (step A2 in FIG. 3).

After that, the FSM generation means 103 creates a finite state machine (FSM) that controls the state transition and logic circuits that control the hardware resources (step A3 in FIG. 3).

After that, the input application/output observation timing signal generation means 104 creates the input application timing signal and the output observation timing signal and logic circuits for the input application timing signal and the output observation timing signal (step A4 in FIG. 3).

After that, the RTL generation means 105 converts the FSM and the control logic circuits, created by the finite state machine generation means 103 in step A3, the logic circuits created by the input application/output observation timing signal generation means 104 in step A4, and the hardware resources to an HDL description, and stores it in the storage device 110 (step A5 in FIG. 3). For the HDL, one of VHDL, Verilog-HDL, SystemVerilog, SystemC, SpecC, C language, C++ language, and C# language is used.

The test bench generation means 106 generates a test bench. The test bench generation means 106 stores the created test bench in the storage device 110 (step A6). As with the RTL description, the test bench is coded in one of VHDL, Verilog-HDL, SystemVerilog, SystemC, SpecC, C language, C++ language, and C# language.

The effect of this example is as follows.

This example is configured in such a way that the input application/output observation timing signal generation means 104 generates signals for externally notifying a state and a condition under which a value is read from an input terminal, or is written to an output terminal, and that the test bench generation means 106 creates a test bench either applies an input or observes an output and compares the output value with an expected value according to the signals.

Therefore, a test bench can be created which can apply an input at the appropriate timing, and observe an output to be compared with an expected value at the appropriate timing.

Second Example

Figure 11:
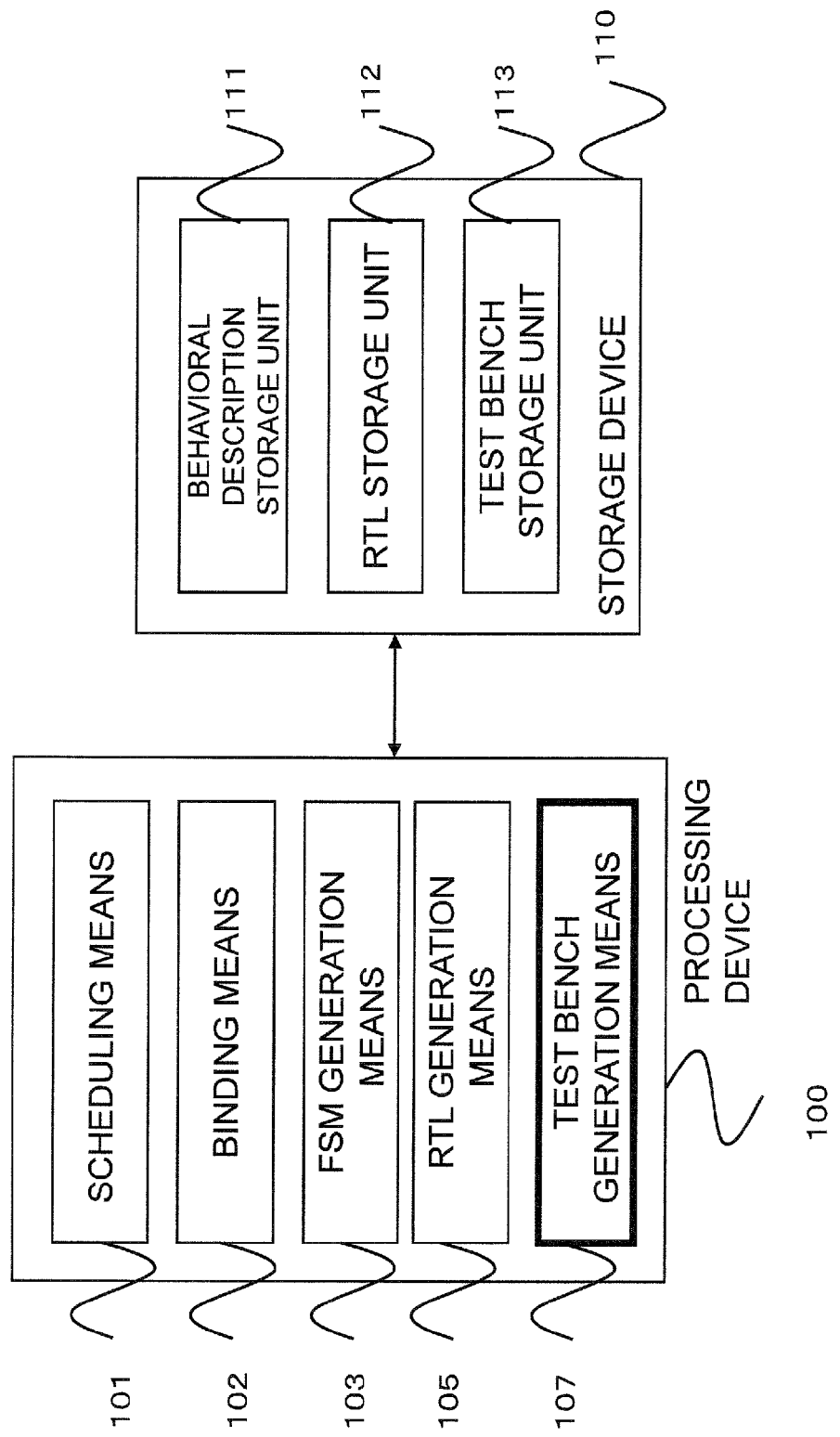
FIG. 11 is a block diagram showing an example of the configuration of a second embodiment of the present invention.
Figure 12:
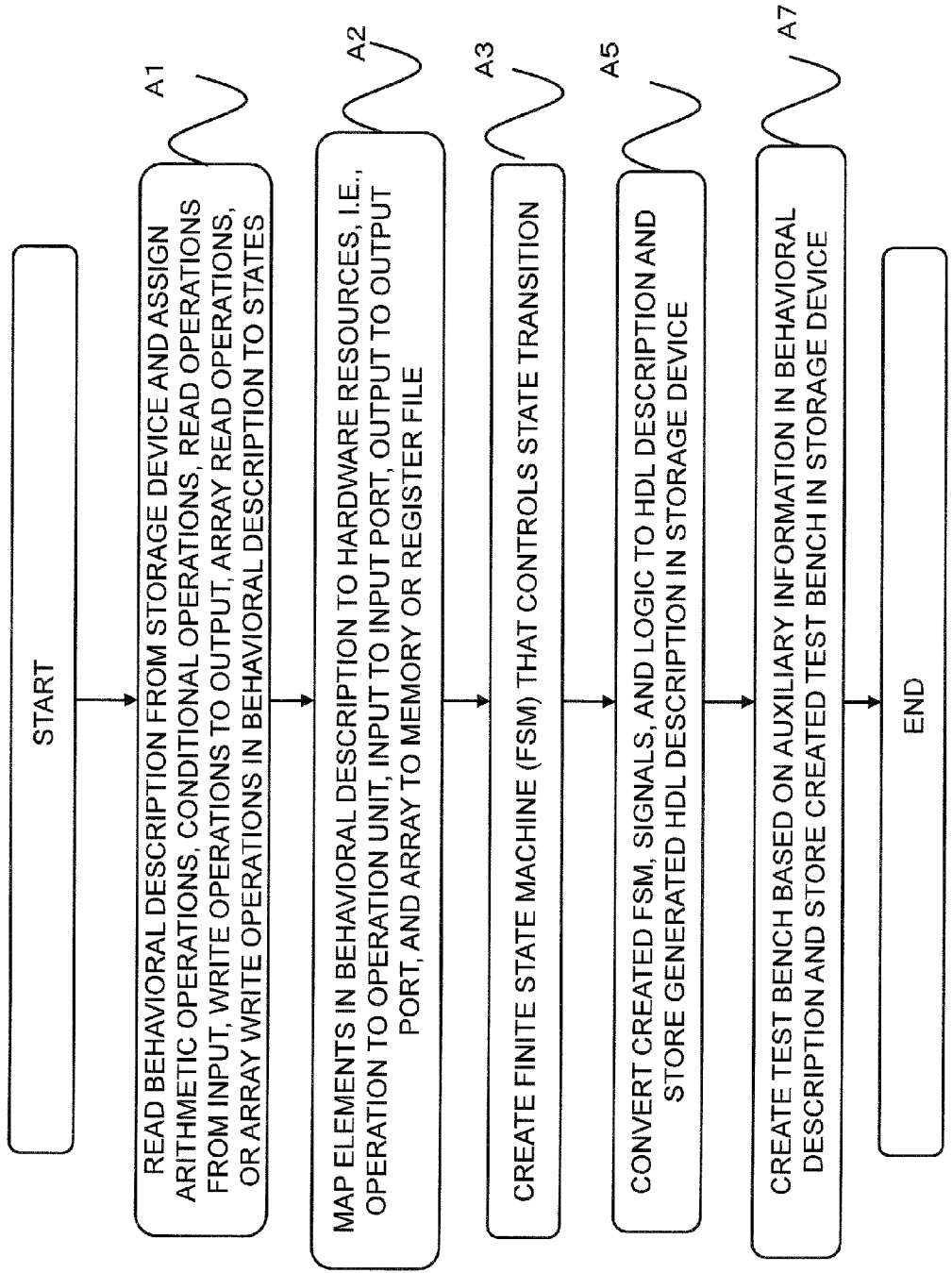
FIG. 12 is a flowchart showing the operation of the second embodiment of the present invention.

Next, a second example of the present invention will be described. FIG. 11 is a diagram showing the configuration of the second example of the present invention. FIG. 12 is a flowchart showing the operation of the second example of the present invention. Referring to FIG. 11, the second example of the present invention has a computer (central processing device; processor; data processing device) 100 that operates under program control, but this computer 100 does not include the input application/output observation timing signal generation means 104 provided in the first example shown in FIG. 1 and, instead of the test bench generation means 106, includes another test bench generation means 107. Referring to FIG. 12, steps A4 and A6 are deleted from the flowchart in FIG. 3 and step A7 is added.

The test bench generation means 107 in this example differs from the test bench generation means 106 in the first example in the following points.

That is, the test bench generation means 107 recognizes the signals in the behavioral description as the input application timing signal and output observation timing signal, respectively. And, the test bench generation means 107 creates logic that observes the signals and, when an active value is output to the signals, either applies an input or observes an output and compares the output value with an expected value (step A7 in FIG. 12). The test bench generation means 107 stores the created test bench in a storage device 110.

Third Example

Figure 14:
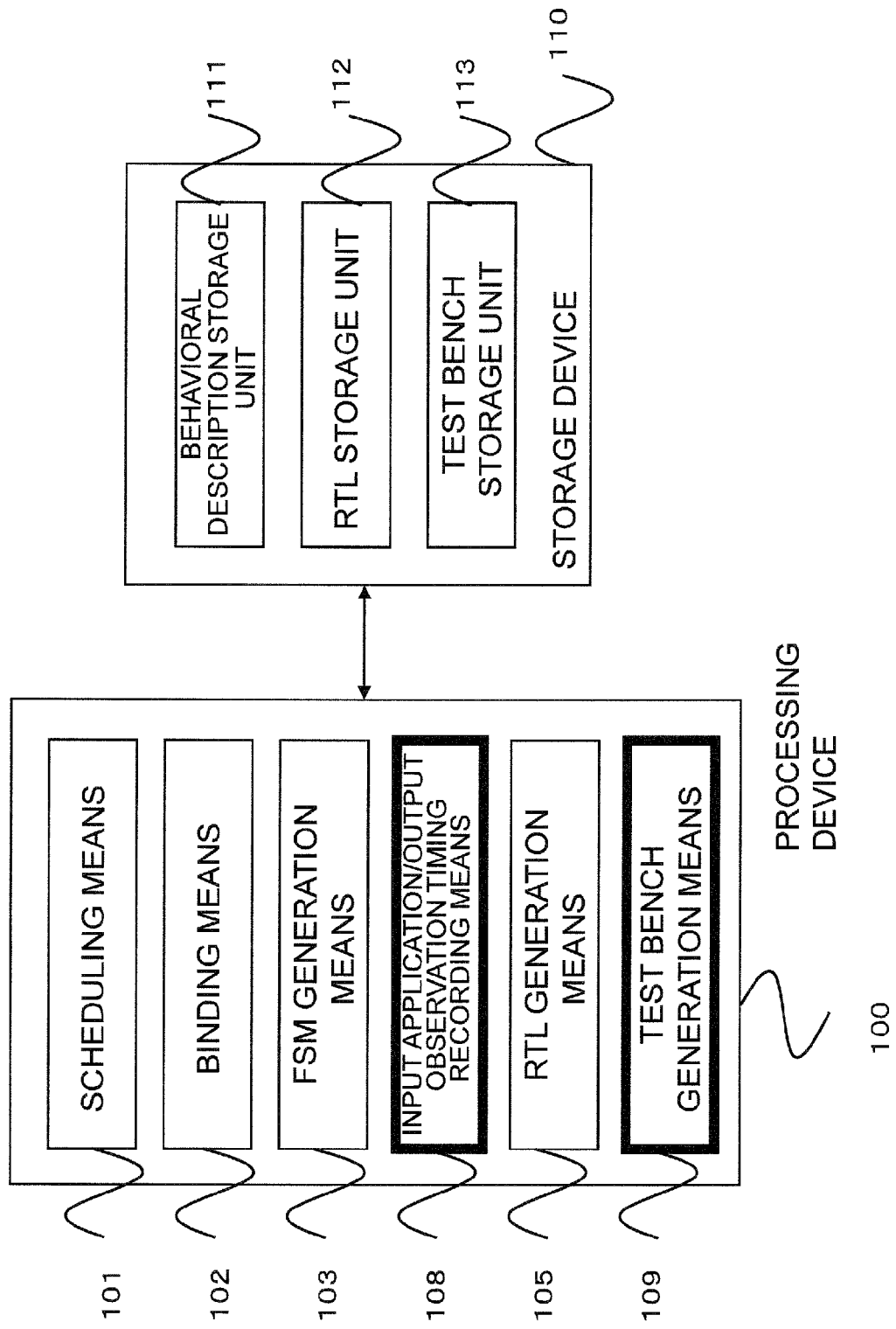
FIG. 14 is a block diagram showing an example of the configuration of a third embodiment of the present invention.

Referring to FIG. 14, a third example of the present invention differs from the first example in that a computer (central processing device; processor; data processing device) 100 that operates under program control has input application/output observation timing recording means 108 instead of the input application/output observation timing signal generation means 104 in the first example shown in FIG. 1 and in that the computer 100 has test bench generation means 109 instead of the test bench generation means 106.

The general operation of the input application/output timing recording means 108 is as follows.

The input application/output observation timing recording means 108 references the control data flow graph and, for each input, records two items of information for each input signal. The first information includes the number of clocks from the time the reset is released to the time a first input value is applied. The second information includes the interval period from the time an input is once applied to the time the next input is applied. At the same time, for each output signal, the input application/output observation timing recording means 108 records two items of information. The first information includes the number of clocks from the time the reset is released to the time the first output value becomes effective. The second information includes the interval period from the time the output value once becomes effective to the time the next output value becomes effective.

The general operation of the test bench generation means 109 is as follows. The test bench generation means 109 creates a test bench that reads the input/output timing, recorded by the input application/output observation timing recording means 108, counts the number of clocks from the time the reset signal is released, and applies an input when the number of clocks matches either the number of clocks at which an input is to be applied or the interval period at which an input is to be applied. At the same time, the test bench generation means 109 creates a test bench that observes an output and compares it with an expected value when the number of clocks from the time the reset is released matches either the number of clocks when the output becomes effective or the interval period at which the output becomes effective. The created test bench is stored in the storage device 110.

This example differs from the technology, disclosed in Patent Document 2, in the following point. That is, in this example, the output observation timing is decided based not on the number of delay cycles from the input but on the number of cycles from the time the reset is released.

Thus, for both an input and an output, the present invention can be applied even to a circuit, to which the invention disclosed in Patent Document 2 cannot be applied, because the input is applied, or the output is observed, based on the number of cycles after the reset is released.

Fourth Example

Next, the following describes a fourth example of the present invention. The fourth example of the present invention differs from the first example in that a computer (central processing device; processor; data processing device) 100, which operates under program control, has the test bench generation means 106 in the first example shown in FIG. 1 that has the following function.

A test bench created by the test bench generation means 106 observes not only the input application/output observation timing signals but also the reset signal and neither applies an input nor observes an output while the reset signal is effective even if an active value is output to the input application/output observation signal. The created test bench is stored in a storage device 110.

The test bench generation means 106 also operates as follows. That is, a test bench created by the test bench generation means 106 observes not only the input application/output observation timing signals but also the stall signal and neither applies an input nor observes an output while the stall signal is effective even if an active value is output to the input application/output observation signal. The created test bench is stored in the storage device 110.

Fifth Example

Next, the following describes a fifth example of the present invention. The fifth example of the present invention differs from the first example in that a computer (central processing device; processor; data processing device) 100, which operates under program control, has the test bench generation means 106 in the first example shown in FIG. 1 that has the function described below. The general operation of the test bench generation means 106 is as follows.

The test bench generation means 106 generates a test bench that has a necessary simulation model if simulation cannot be performed by an RTL description alone generated by RTL generation means 105.

Simulation cannot be performed by an RTL description alone, for example, when the behavioral description includes an array for which an interface circuit for accessing the memory is generated in the RTL description. In this case, the test bench generation means 106 creates a test bench that includes a simulation model for the memory.

Simulation cannot be performed either, for example, when the behavioral description includes a complex operation such as multiplication and division for which a black box is output for this operation part in the RTL description. In this case, the test bench generation means 106 creates a test bench that includes a simulation model for the corresponding operation.

The following describes the present invention using specific examples.

Specific Example_1

First, a first specific example of the present invention will be described. This specific example corresponds to the first example of the present invention described above. FIG. 4 shows an example of a behavioral description. The behavioral description in FIG. 4 is coded in the C language.

The input terminals of the function func( ) are the variables a, b, c, and d of type int, and the output terminal is the variable o of type int. The output value o of this function is:

the total sum of all inputs (a, b, c, d) when the value of the input c is 0 and the sum of the input a and b when the value of the input c is not 0. The behavioral description is stored in advance in the behavioral description storage unit 111 in the storage device 110.

A behavioral synthesis apparatus in the first example reads the behavioral description in FIG. 4 from the behavioral description storage unit 111 in the storage device 110, the RTL generation means 105 creates an RTL description shown in FIGS. 9A and 9B, the test bench generation means 106 creates a test bench shown FIG. 10, and they store the created RTL description and the test bench, respectively, in the RTL storage unit 112 and the test bench storage unit 113 of the storage device 110.

First, the scheduling means 101 in the computer 100 assigns the behavioral description to the states (step A1 in FIG. 3). That is, the scheduling means 101 assigns arithmetic operations, conditional operations, read operations from inputs, write operations to outputs, array read operations, and array write operations, included in the behavioral description, to the states.

In the behavioral description in FIG. 4, there are described the following:

read operations from a and b and addition+on the fifth line, read operation from c and conditional operation== on the sixth line, read operations from c and d and addition+on the seventh line, and addition+and write operation to an output o on the ninth line.

FIG. 5 shows an example of how the scheduling means 101 assigns operations in the behavioral description to states. FIG. 5 shows that the scheduling means 101 assigns:

read operations from a and b and addition+on the fifth line to state STATE1, read operation from c and conditional operation== on the sixth line and read operations from c and d and addition+on the seventh line to state STATE2, respectively, and addition+and write operation to the output o on the ninth line to state STATE3.

Next, the binding means 102 in the computer 100 maps elements in the behavioral description to the hardware resources (step A2 in FIG. 3).

That is, the binding means 102 maps:

an operation in the behavioral description to an operation unit, an input terminal in the behavioral description to an input terminal in the RTL description an output terminal in the behavioral description to an output terminal in the RTL description and an array in the behavioral description to an RTL memory or a register file.

FIGS. 6A, 6B, 6C, 6D, 6E and 6F show schematic examples of how the binding means 102 maps the operations to the operation units.

FIGS. 6A, 6B, 6C, 6D, 6E and 6F show that the addition+ on the fifth line, the addition+on the seventh line, and the addition+on the ninth line in FIG. 6A are all mapped to one operation unit ADD (FIG. 6D) and that the conditional== on the sixth line in FIG. 6A is mapped to the comparator EQ (FIG. 6E).

FIGS. 7A, 7B, 7C, 7D, 7E and 7F show an example of how the binding means 102 maps the inputs and the output in the behavior level to the input terminals and the output terminal in the RTL.

FIGS. 7A, 7B, 7C, 7D, 7E and 7F show that the input a on the fifth line and the input c on the sixth line and the seventh line in FIG. 7A are mapped to the input terminal iport1 (FIG. 7B), that the input b on the fifth line and the input d on the seventh line in FIG. 7A are mapped to the input terminal iport2 (FIG. 7C), and that the output o on the tenth line in FIG. 7A is mapped to the output terminal oport1 (FIG. 7F), respectively.

Next, the finite state machine (FSM) generation means 103 creates a finite state machine (FSM) that controls the state transition and the control logic circuits that control the hardware resources (step A3 in FIG. 3).

FIGS. 8A and 8B show an example of a finite state machine and a control logic circuit as well as the hardware resources controlled by the control logic circuit. This example is coded in Verilog-HDL. In the example shown in FIGS. 8A and 8B, the finite state machine and the control logic circuit are represented by the state register "state" and the case( ) statement. FIGS. 8A and 8B are divided for the sake of creating the drawing, and the range from "module (input/output terminal list)" to "endmodule" constitutes one circuit module.

The input terminals, output terminals, operation units, and storage devices (registers) are used as the hardware resources. The terminals iport1 and iport2 are used as the input terminals. The terminal oport1 is used as the output terminal. The adder ADD and the comparator EQ are used as the operation units, and they are represented as the addition+and comparison== in the example in FIGS. 8A and 8B. The terminals v0 and v1 are used as the storage devices (registers). In addition, the reset signal rst and clock signal clk are used. The general operation of the module 'main' is as follows.

The following operations are performed when the clock signal clk rises. If the input of the reset terminal rst is 1, the value of the state register 'state' is set to T_STATE1 and the registers v0, v1, and o_t are initialized to 0.

If the input of the reset terminal rst is not 1 when the clock signal clk rises, the following operation is performed. When the value of the state register 'state' is T_STATE1, the values are read from the input terminals iport1 and iport2 respectively, the sum of the values is calculated by the adder ADD, the calculation result is stored in the register v0. After that, the value of the state register 'state' is updated to T_STATE2.

When the value of the state register 'state' is T_STATE2, the values are read from the input terminals iport1 and iport2 respectively, and the value read from iport1 is compared with 0 by the comparator EQ. If the value read from the input terminal iport1 is 0, the sum of the values read from the input terminals is calculated by the adder ADD and the calculation result is stored in the register v1. After that, the value of the state register 'state' is updated to T_STATE3.

When the value of the state register 'state' is T_STATE3, the sum of the values of the registers v0 and v1 is calculated by the adder ADD and the calculation result is written to the output terminal oport1. After that, the value of the state register 'state' is updated to T_STATE1.

The value of the state register 'state' is updated sequentially in order of T_STATE1, T_STATE2, T_STATE3, T_STATE1, and so on.

If a test bench applies the values of inputs a, b, c, and d to the input terminals iport1 and iport2 at appropriate timing, respectively, and observes the value of the output terminal oport1 at appropriate timing, the module implements the function func( ) in the behavioral description.

Next, the input application/output observation timing signals generation means 104 creates the input application/output observation timing signals and the logical circuits for those signals (step A4 in FIG. 3).

FIGS. 9A and 9B show an example in which the input application/output observation timing signals and the logic circuits for those signals are added to the description shown in FIGS. 8A and 8B.

The behavioral description in FIG. 4 includes the input terminals a, b, c, and d and the output terminal o. Referring to FIGS. 9A and 9B, the input application timing signal a_e, b_e, c_e, and d_e are added corresponding to the inputs a, b, c, and d, respectively. The output observation timing signal o_e is added corresponding to the output signal o. The logic circuits that determine the output values of the signals a_e, b_e, c_e, d_e and o_e are also added.

In the RTL description generated as a result of behavioral synthesis by the scheduling means and the binding means, the value of the input signal a corresponding to the fifth line in the behavioral description is acquired from the input terminal iport1 in the state STATE1. Therefore, the logic circuit (assign a_e=(state==T_STATE1)? 1'b1:1'b0;) is created so that the input application timing signal a_e also has the active value (1(High)) only in the state STATE1.

Similarly, the value of the output signal o is written into the output terminal oport1 in the state STATE3. Therefore, the logic circuit (assign o_e=(state==T_STATE3)?1'b1:1'b0;) is created so that the output observation timing signal 0_e has the active value (1(High)) only in the state STATE3.

Next, the RTL generation means 105 converts the FSM, control logic circuits, input application/output observation timing signals and respective logical circuits for input application/output observation timing signals, and hardware resources to the HDL description and stores the generated HDL description in the storage device 110 (step A5 in FIG. 3). FIGS. 9A and 9B show an example of the HDL (Verilog-HDL) description generated by the RTL generation means 105.

Next, the test bench generation means 106 generates a test bench. The test bench observes the input application timing signal and at the timing when the signal has an active value applies an input value to the corresponding input terminal. The test bench also observes the output timing signal and at the timing when the signal has an active value reads a value from the corresponding output terminal and compares the value with an expected value.

FIG. 10 shows a test bench created by the test bench generation means 106. The example in FIG. 10 is coded in pseudo-code similar to Verilog-HDL. The general operation of the generated test bench is as follows.

The input value of the input signal a is applied to the input terminal iport1 assuming that the value of the input signal a is acquired from the input terminal iport1 when the input application timing signal a_e has the active value (1(High)). The input value of the input signal b is applied to the input terminal iport1 assuming that the value of the input signal b is acquired from the input terminal iport1 when the input application timing signal b_e has the active value (1(High)). The input value of the input signal c is applied to the input terminal iport2 assuming that the value of the input signal c is acquired from the input terminal iport2 when the input application timing signal c_e has the active value (1(High)). The input value of the input signal d is applied to the input terminal iport2 assuming that the value of the input signal d is acquired from the input terminal iport2 when the input application timing signal d_e has the active value (1(High)).

Similarly, the value of the output terminal oport1 is observed and compared with the expected value of the output signal o assuming that the value of the output signal o is written to the output terminal oport1 when the output observation timing signal o_e has the active value (1(High)). The module 'main' dut (input/output terminal list) in FIG. 10 is a test target module.

Specific Example_2

Next, a second specific example of the present invention will be described. This example corresponds to the second example described with reference to FIG. 11 and FIG. 12. FIG. 13 shows an example of a behavioral description. The behavioral description in FIG. 13 differs from the behavioral description in FIG. 4 in that the output signals a_e, b_e, c_e, d_e, and o_e are provided and that the write operations for the output signals a_e and b_e, output signal c_e, output signal d_e, and output signal o_e are specified respectively on line 16, line 17, line 20, and line 23.

In the behavioral description in FIG. 13, the output signals a_e, b_e, c_e, d_e, and o_e are output signals indicating the input timing and the output timing of a, b, c, d, and o. For each signal of a_e, b_e, c_e, d_e, and o_e, write operation is also coded in the behavioral description. The write operation writes an active value (1) when an input/output access is made to an associated signal.

In the declaration part of the behavioral description, as a comment (pragma) for the signal b, it is specified that the signal b_e corresponds to the input signal b and that b_e is an input application timing signal of b. The phrase "pragma enable_signal_is b_e" immediately following the comment symbol "//" on the second line is an instruction (pragma) to the simulator specifying that the input application timing signal of b is b_e.

Conversely, as a comment (pragma), it is specified that the signal c_e corresponds to the input signal c and c_e is an input application timing signal of c. The phrase "pragma enable_signal_for c" immediately following the comment symbol "//" on the seventh line is an instruction (pragma) to the simulator specifying that c_e is an input application timing signal of c.

A behavioral synthesis apparatus in the second example of the present invention reads the behavioral description in FIG. 13 from a behavioral description storage unit 111 of the storage device 110 in FIG. 11 and, through the execution of scheduling means 101, binding means 102, FSM generation means 103, and RTL generation means 105, generates the module 'main' shown in FIGS. 9A and 9B. The operation of the module 'main' is as described above.

After that, test bench generation means 107 in FIG. 11 generates a test bench. The test bench observes the input application timing signals and at the timing when the signal has an active value applies an input value to the corresponding input terminal. The test bench also observes the output timing signals and at the timing when the signal has an active value reads a value from the corresponding output terminal and compares the value with an expected value. At this time, the signals originally included in the behavioral description are used for the input application/output observation timing signals.

FIG. 10 shows the created test bench. The test bench in this example is coded in pseudo code similar to Verilog-HDL.

The signal a_e is used for the input application timing signal of the signal a. This is determined based on the similarity in the signal names.

The signal b_e is used for the input application timing signal of the signal b. This is determined based on the comment (pragma) (see FIG. 13) of the signal b.

The signal c_e is used for the input application timing signal of the signal c. This is determined based on the comment (pragma) (see FIG. 13) of the signal c.

The signal d_e is used for the input application timing signal of the signal d. This is determined based on the description in which the reference to the signal d and the output to the signal d_e are described continuously in the behavioral description (see lines 19 and 20 in FIG. 13).

The operation of the test bench in FIG. 10 is as described above.

Specific Example_3

Next, a third specific example of the present invention will be described. The third example of the present invention corresponds to the third example described with reference to FIG. 14. FIG. 15 shows an example of a behavioral description. In FIG. 15, the input to the function func( ) is variables a, b, c, and d of type int, and the output is variables o1 and o2 of type int. The output of the function func( ) is the sum of the inputs a and b, and the output o2 is the total sum of the inputs a, b, c, and d.

The behavioral description is stored in advance in a behavioral description storage unit 111 of a storage device 110 shown in FIG. 14.

A behavioral synthesis apparatus in the third example of the present invention reads the behavioral description in FIG. 15 from the behavioral description storage unit 111 of the storage device 110 in FIG. 14. RTL generation means 105 creates an RTL description shown in FIGS. 18A and 18B, test bench generation means 109 creates a test bench shown in FIG. 19, and they store the created RTL description and the test bench, respectively, in an RTL storage unit 112 and a test bench storage unit 113 of the storage device 110.

First, scheduling means 101 in the computer 100 assigns the behavioral description to the stages. That is, the scheduling means 101 assigns the arithmetic operations, condition operations, read operations from inputs, write operations to outputs, array read operations, and array write operations, which are included in the behavioral description, to associated states (stages).

In the behavioral description in FIG. 15, there are described the following:

read operations from inputs a and b and addition+on eleventh line, read operations from inputs b and c and addition+on twelfth line, write operation to output o1 on thirteenth line, addition+on fourteenth line, and write operation to output o2 on fifteenth line.

FIG. 16 shows an example of how the scheduling means 101 assigns a behavioral description to stages. FIG. 16 shows that the scheduling means 101 assigns the read operations from the inputs a and b and the addition+on the eleventh line to STAGE1, the read operations from the inputs b and c and the addition+on the twelfth line to STAGE2, the write operation to the output o1 on the thirteenth line and the addition+on the fourteenth line to STAGE3, and the write operation to the output o2 on the fifteenth line to STAGE4.

After that, through binding means 102 and FSM generation means 103 of the computer 100, the module 'main' shown in FIGS. 17A and 17B is generated.

FIGS. 17A and 17B show the module 'main' generated after the execution of the binding means 102 and the FSM generation means 103. The example shown in FIGS. 17A and 17B is coded in Verilog-HDL. This module is synthesized as a pipeline circuit. All stages, STAGE1-STAGE4, operate in each clock period in synchronization with the clock signal.

After that, the input application/output observation timing recording means 108 references the control data flow graph and records two items of information for each input signal. The first information includes the number of clock cycles from the time when the reset is released to the time when the first input value is applied. The second information includes the interval period of input application. In addition the input application/output observation timing recording means 108 records two items of information for each output signal. The first information includes the number of clock cycles from the time when the reset is released to the time when the first effective value is written into the signal. The second information includes the interval period of output observation. FIGS. 18A and 18B show the module 'main' in which this information is recorded in the module 'main' shown in FIGS. 17A and 17B.

An input is applied to each of the input signals a and b of the module 'main' in each cycle beginning with the next clock after the reset is released and, so, the information is recorded in the module. That is, "1, 1" on the comment lines of the input signals a and b in the declaration part, such as the one shown in FIG. 18A, indicates that the signals become effective one clock after the reset is released and that the interval period is one clock cycle.

An input is applied to each of the input signals c and d in each cycle beginning with the second clock after the reset is released and, so, the information is recorded in the module. That is, "2, 1" on the comment lines of the input signals c and d in the declaration part, such as the one shown in FIG. 18A, indicates that the signals become effective two clocks after the reset is released and that the interval period is one clock cycle.

The output value of the output signal o1 becomes effective in each cycle beginning with the third clock after the reset is released and, so, the information is recorded in the module. That is, "3, 1" on the comment line of the output signal of in the declaration part, such as the one shown in FIG. 18A, indicates that the signal becomes effective three clocks after the reset is released and that the interval period is one clock cycle.

The output value of the output signal o2 becomes effective in each cycle beginning with the fourth clock after the reset is released and, so, the information is recorded in the module. That is, "4, 1" on the comment line of the output signal o2 in the declaration part, such as the one shown in FIG. 18A, indicates that the signal becomes effective four clocks after the reset is released and that the interval period is one clock cycle.

After that, the RTL generation means 105 and the test bench generation means 109 shown in FIG. 14 create an RTL description and a test bench and store them in the storage device 110.

FIG. 19 shows an example of a test bench created by the test bench generation means 109 shown in FIG. 14. The example in FIG. 19 is coded in pseudo code similar to Verilog-HDL.

The general operation of the generated test bench is as follows. Beginning with the first clock cycle after the reset is released and in each clock period, input values are applied to the input terminals a and b respectively.

Beginning with the second clock cycle after the reset is released and in each clock period, input values are applied to the input terminals c and d respectively.

Beginning with the third clock cycle after the reset is released and in each clock period, the value of the output terminal o1 is observed and compared with the expected value.

Beginning with the fourth clock cycle after the reset is released and in each clock period, the value of the output terminal o2 is observed and compared with the expected value.

Specific Example_4

Next, a fourth specific example of the present invention will be described. The fourth example of the present invention corresponds to the fourth example described above. FIG. 20 shows an example of a test bench created by test bench generation means 106 in the fourth example of the present invention.

FIG. 20 shows the general operation of the generated test bench.

The input value of the input signal a is applied to the input terminal iport1 assuming that the value of the input signal a is acquired from the input terminal iport1 when the value of the input application timing signal a_e is an active value (1(High)) and when the reset is not effective. The input value of the input signal b is applied to the input terminal iport1 assuming that the value of the input signal b is acquired from the input terminal iport1 when the value of the input application timing signal b_e is an active value (1(High)) and when the reset is not effective. The input value of the input signal c is applied to the input terminal iport2 assuming that the value of the input signal c is acquired from the input terminal iport2 when the value of the input application timing signal c_e is an active value (1(High)) and when the reset is not effective. The input value of the input signal d is applied to the input terminal iport2 assuming that the value of the input signal d is acquired from the input terminal iport2 when the value of the input application timing signal d_e is an active value (1(High)) and when the reset is not effective.

The value of the output terminal oport1 is observed and is compared with the expected value of the output signal o assuming that the value of the output signal o is written to the output terminal oport1 when the value of the output observation timing signal o_e is an active value (1(High)) and when the reset is not effective.

FIG. 21 shows another example of a test bench created by the test bench generation means 106 in the fourth example.

The values of the input signals a and b are applied respectively to the input terminals a and b beginning with the first clock cycle after the reset is released, in each clock period, and when the stall signal is not effective. The values of the input signals c and d are applied to the input terminals c and d beginning with the second clock cycle after the reset is released, in each clock period, and when the stall signal is not effective.

The values of the output terminals o1 and o2 are observed and compared respectively the expected values beginning with the third clock cycle or fourth clock cycle after the reset is released, in each clock period, and when the stall signal is not effective.

Specific Example_5

Next, a fifth specific example of the present invention will be described. The fifth example of the present invention corresponds to the fifth example described above. FIG. 22 shows an example of the behavioral description. The general operation of this behavioral description is as follows.

First, the values are read from the input signals a and b, and the value of the input signal b is written at the address in the array ary [ ] indicated by the value of the input signal a.

Next, the value is read from the input signal c, and the value at the address in the array ary[ ], indicated by the value of the input signal c, is read and is output to the output signal o1.

FIGS. 23A and 23B show examples of an RTL description that is generated by the execution of scheduling means 101, binding means 102, FSM generation means 103, and RTL generation means 105 in the fifth example of the present invention. The description shown in FIGS. 23A and 23B include a memory interface circuit for accessing the array ary[ ]. The signals ad, rd, wd, and we correspond, respectively, to the address, read data, write data, and write enable flag.

The general operation of the module 'main' is as follows. The following operation is performed when the clock signal clk rises. If the input to the reset terminal rst is 1, the value of the state register 'state' is set to T_STATE1 and the registers v0, v1, and o_t are initialized to 0.

The module 'main' operates as follows if the input to the reset terminal rst is not 1 when the clock signal clk rises. When the value of the state register 'state' is T_STATE1, the module reads the input signals a and b, stores the values of those signals respectively in the registers ad_t and wd_t, stores 1 in we_t, and updates the value of the state register 'state' to T_STATE2.

When the value of the state register 'state' is T_STATE2, the module reads the input signal c, stores its value in ad_t, stores 0 in we_t, and updates the value of the state register 'state' to T_STATE3.

When the value of the state register 'state' is T_STATE3, the module updates the value of the state register 'state' to T_STATE4. When the value of the state register 'state' is T_STATE4, the module stores the read data rd in the register o_t and updates the value of the state register 'state' to T_STATE1. The value of the state register 'state' is updated in order of T_STATE1, T_STATE2, and so on.

FIG. 24 shows a test bench generated by the test bench generation means 106. In this test bench, not only the test target module (main dut( . . . )) but also the memory simulation model m1(memory m1( . . . )) corresponding to the array ary[ ] is created and the necessary wire connection is made.

The present invention can be used to make sure that a behavioral description is equivalent to an RTL description generated by behavioral synthesis. The present invention can also be used to make sure that the RTL description generated by behavioral synthesis gives full performance.

While the present invention has been described with reference to the examples above, it is to be understood that the present invention is not limited to the configuration of the examples above and that modifications and changes that may be made by those skilled in the art within the scope of the present invention are included.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A behavioral synthesis apparatus comprising:
   storage means that stores a behavioral description of a circuit; and
   test bench generation means that generates a test bench that counts a number of clocks after a reset of said circuit is released and, when the number of clocks matches a predetermined value, applies an input to, and observes an output from, said circuit, respectively.

2. The behavioral synthesis apparatus according to claim 1, further comprising:
   input application/output observation timing recording means that references a control data flow graph and records timing information for each of input signals, said timing information being composed of a number of clocks from a time a reset is released to a time a first input value is applied and an interval period from a time an input is once applied to a time a next input is applied, and records timing information for each of output signals, said timing information including of a number of clocks from a time a reset is released to a time a first output value becomes effective and an interval period from a time the output value once becomes effective to a time a next output value becomes effective; wherein
   said test bench generation means reads the input and output timing information recorded by said input application/output observation timing recording means and creates the test bench and stores the created test bench in a storage device, wherein said test bench counts a number of clocks from a time a reset signal that is input to said circuit is released and applies an input when the number of clocks matches either a number of signal clocks at which an input is to be applied or the interval period at which an input is to be applied, and observes an output and compares the output with an expected value when a number of clocks from a time the reset signal is released matches either a number of clocks until the output becomes effective or the interval period at which the output becomes effective.

3. The behavioral synthesis apparatus according to claim 1, wherein, for an input signal and an output signal, timing information, which indicates a number of clocks from a time a reset is released to a time a first input value or a first output value becomes effective and an input application period or an output observation period, are added in respective comment fields of the input signal and the output signal in a declaration part of the behavioral description; and said test bench generation means generates the test bench that counts a number of clocks from a time a reset is released and, when the number of clocks matches the timing information on the input signal and the output signal, applies an input to said circuit or observes an output from said circuit.

4. A behavioral synthesis method comprising:

reading a behavioral description of a circuit from a storage; and creating, using a computer, a test bench that counts a number of clocks after a reset of said circuit is released, and, when the number of clocks matches a predetermined value, applies an input to, and observes an output from, said circuit, respectively.

5. A computer readable storage device having a program causing a computer to perform:

reading a behavioral description of a circuit from a storage; and test bench generation processing for creating a test bench that counts a number of clocks after a reset of the circuit is released, when the number of clocks matches a predetermined value, applies an input to, and observes an output from, said circuit, respectively.

* * * * *